US008242771B2

(12) United States Patent
Cheung

(10) Patent No.: US 8,242,771 B2
(45) Date of Patent: Aug. 14, 2012

(54) CURRENT SENSING INDUCTOR AND A CIRCUIT THEREOF

(75) Inventor: Chi Hung Cheung, Tseung Kwan O. (HK)

(73) Assignee: PI International Ltd., Tortola (VG)

( * ) Notice: Subject to any disclaimer, the term of this patent is extended or adjusted under 35 U.S.C. 154(b) by 586 days.

(21) Appl. No.: 12/289,558

(22) Filed: Oct. 30, 2008

(65) Prior Publication Data

US 2010/0109648 A1 May 6, 2010

(51) Int. Cl.
*G01R 1/20* (2006.01)
*G01R 15/18* (2006.01)

(52) U.S. Cl. ........................................ 324/126; 324/127

(58) Field of Classification Search .................. 324/126, 324/127, 117 R, 117 H, 547, 762.01–762.1, 324/754.01–754.3; 257/48; 438/14–18
See application file for complete search history.

(56) References Cited

U.S. PATENT DOCUMENTS 3,768,012 A * 10/1973 Wilkinson .................... 324/127
4,727,316 A * 2/1988 Shen et al. .................... 324/127
6,380,836 B2 * 4/2002 Matsumoto et al. .......... 336/200
6,956,748 B2 * 10/2005 Nakagawa ...................... 363/16
7,054,167 B2 * 5/2006 Yasumura ...................... 363/16

* cited by examiner

*Primary Examiner* — Jermele M Hollington
*Assistant Examiner* — Tung X Nguyen
(74) *Attorney, Agent, or Firm* — Rosenberg, Klein & Lee

(57) ABSTRACT

An inductor design having a detection winding which is magnetically coupled to the existing winding and its induction voltage is used to cancel that of the existing winding. Having the induction voltage cancelled, the voltage across the existing winding represents a resistive voltage drop of the existing winding current. The detection winding is furthermore built with a non-inductive portion having a significantly higher DC resistance in proportion to that of the existing winding. This resistance proportion is insensitive against temperature variations when both the existing and the detection windings are built with the same material and subjected to the same environment. A reference current is fed through the detection winding to produce a reference resistive voltage drop which is used to cancel the resistive voltage drop across the existing winding. When a precise cancellation occurs, the existing winding current is known to be in exact proportion to the reference current.

4 Claims, 5 Drawing Sheets

CURRENT SENSING INDUCTOR AND A CIRCUIT THEREOF

BACKGROUND OF THE INVENTION

1. Field of the Invention

The present invention relates to the constructions of an inductor and a circuit thereof. In particular, the present invention relates to a current sensing inductor and a circuit thereof.

2. Description of Related Art

Inductors are commonly used in switched mode power conversion circuits for energy storage and for current and voltage filtering. In those applications, the instantaneous current flowing through inductor is a critical parameter for proper control circuit operation. Therefore, a variety of methods for measuring inductor current have been proposed.

Reference is made to FIG. 1, which shows a circuit diagram of a current sensing circuit of the prior art, wherein the circuit shows the output portion of the buck or forward type converter. As shown in FIG. 1, the current sensing circuit 1 includes an inductor 11, a current sensing resistor 12, and a sensing amplifier 15. The inductor 11 includes an inductive winding 111 and a winding resistance 113. An inductor current flowing through the inductor 11 is transferred to a capacitor 13 via a current sensing resistor 12. When inductor current flows, it flows through the current sensing resistor 12 and develops a small voltage drop across the current sensing resistor 12. The sensing amplifier 15 detects this small voltage drop and amplifies it for the use of a control circuit (not shown in the figure). Although the voltage drop across the current sensing resistor 12 is low, the power loss can be large when the inductor current is high. For example, when the voltage drop is 50 mV but the inductor current is 20 A, a significant power loss of 1 W is resulted.

Reference is made to FIG. 2, which shows the circuit diagram of another current sensing circuit of the prior art. As shown in FIG. 2, the current sensing circuit 2 includes an inductor 21, a current sensing transformer 22, a sensing amplifier 25, a rectifier diode 27, and a current sensing resistor 29. The inductor 21 includes an inductive winding 211 and a winding resistance 213. An inductor current flowing through the inductor 21 is transferred to a capacitor 23 via a current sensing transformer 22. When inductor current flows, it flows through the current sensing transformer 22 and induces a current into the current sensing resistor 29 via the rectifier diode 27. A voltage drop is developed across the current sensing resistor 29. The sensing amplifier 15 detects this voltage drop and amplifies it for the use of a control circuit (not shown in the figure).

Compared with FIG. 1, the current sensing circuit in FIG. 2 uses the turn-ratio of the current sensing transformer 22 to multiply the voltage drop across the current sensing resistor 29. Therefore, the voltage drop across the primary winding 221 of the current sensing transformer 22 is very small and hence the power loss problem is mitigated. However, the current sensing circuit in FIG. 2 is not suitable for continuous-inductor-current-mode operation. Because DC component within the inductor current will magnetically saturate the current sensing transformer 22 and make it useless. With the circuit operating in discontinuous-inductor-current-mode, the rectifier diode 27 allows the current sensing transformer 22 to magnetically reset whenever the inductor current reverses of interrupts. Even though, the accuracy of this sensing circuit is suffered from magnetising current within the current sensing transformer 22 when the inductor current flows uninterrupted for too long a period.

Reference is made to FIG. 3, which shows a circuit diagram of another current sensing,circuit of the prior art. As shown in FIG. 3, the current sensing circuit 3 includes an inductor 31, a low-pass filter 32, and a sensing amplifier 35. The inductor 31 includes an inductive winding 311 and a winding resistance 313. The winding resistance 313 is used as a current sensing resistor. An inductor current flowing through the inductor 31 is transferred to a capacitor 33. The low-pass filter 32 includes a series resistor 321 and a shunt capacitor 323 for sensing the small voltage drop across the winding resistance 313. The voltage across the whole inductor 31 is transferred via the low-pass filter 32 to the sensing amplifier 35. The sensing amplifier amplifies its input for the use of a control circuit (not shown in the figure).

The low-pass filter 32 is necessary for attenuating the large ripple voltage existing across the inductive winding 311. Without a strong low-pass filter, the relatively weak voltage drop across the winding resistance 313 won't be detectable. This sensing circuit eliminates the power loss associated with an explicit current sensing resistor. But the strong low-pass filter introduces heavy delay to the detection response time. That makes control loop compensation difficult. Also, the value of winding resistance 313 is often sensitive to temperature variations. That makes current sensing very inaccurate.

SUMMARY OF THE INVENTION

The object of the invention is to provide a means for accurate inductor current detection without the need of a current sensing resistor, a current sensing transformer, or a strong low-pass filtering circuit, thereby eliminating the power loss associated with a current sensing resistor, the inaccuracy with a current sensing transformer, and the response delay due to a strong low-pass filtering circuit.

One aspect of the present invention is to provide a current sensing inductor. The inductor has a detection winding which is magnetically coupled with the existing winding of the inductor and the induction voltage of the detection winding is used to cancel the induction voltage of the existing winding. Having the induction voltage cancelled, the voltage across the existing winding becomes a resistive voltage drop of the current flowing, through the same.

Another aspect of the present invention is to provide a current sensing inductor, and a circuit thereof that eliminate inaccuracy due to thermal drift in the resistive voltage drop. The current sensing inductor has a detection winding which is connected in series with the existing winding of the inductor to form a serial circuit. The detection winding of the inductor is composed of an inductive portion and a non-inductive (fieldless) portion. The inductive portion is magnetically coupled with the existing winding. The induction voltage of the inductive portion in the detection winding is used to cancel the induction voltage of the existing winding. Because of this cancellation, the voltage across the serial circuit becomes a resistive voltage drop of the current flowing through the existing winding. The non-inductive portion has a DC resistance which is significantly higher than, and in a fix proportion with, that of the existing winding. This fix proportion is insensitive to ambient temperature change as both the existing and the detection windings are built with the same material and subjected to the same temperature. When a reference current flows through the detective winding, a reference voltage is developed across the non-inductive portion of the detection winding. The reference voltage is used to cancel the voltage drop generated by an inductor current flowing through the existing winding. Therefore, when the voltage across the serial circuit is zero, the inductor current and the reference current is known to be in the aforementioned fix proportion.

The present invention also discloses a circuit with the inductor. The circuit feeds a reference current through the detection winding. The non-inductive portion of the detection winding develops a reference resistive voltage drop which is used to cancel the resistive voltage drop across the existing winding. The invention circuit detects the occurrence of an exact cancellation, and signifies a-control circuit that the existing winding current is at a known value which is in a fix proportion with the reference current.

For further understanding of the present invention, reference is made to the following detailed description illustrating the embodiments exemplifying the present invention. The description is for illustrative purpose only and is not intended to limit the scope of the claim.

BRIEF DESCRIPTION OF THE DRAWINGS

The drawings included herein provide a further understanding of the present invention. A brief introduction of the drawings is as follows.

DETAILED DESCRIPTION OF PREFERRED EMBODIMENTS

The present invention provides a current sensing inductor and a current sensing circuit. A detection winding is added to the inductor and the induction voltage of the detection winding is used for canceling the induction voltage of the existing inductor winding to provide a pure resistive voltage drop for current sensing. It requires no sensing resistors or low-pass filters. Therefore, problems in prior arts, such as power loss or response time delay, are mitigated.

Key features of the present invention are the design of the inductor and the application of the inductor in the current sensing circuit. These features are described below.

Figure 1:
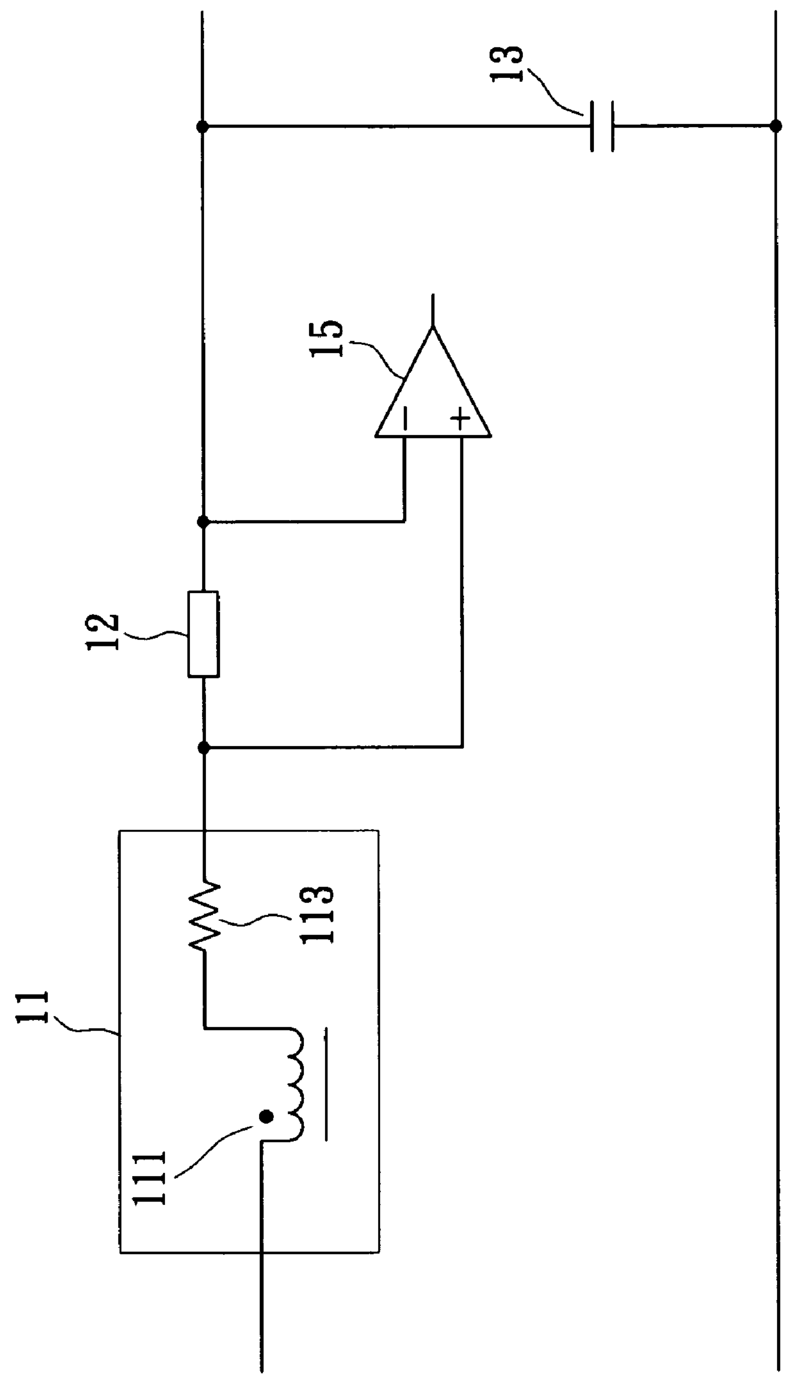
FIG. 1 is a circuit diagram of the current sensing circuit of the prior art.
Figure 2:
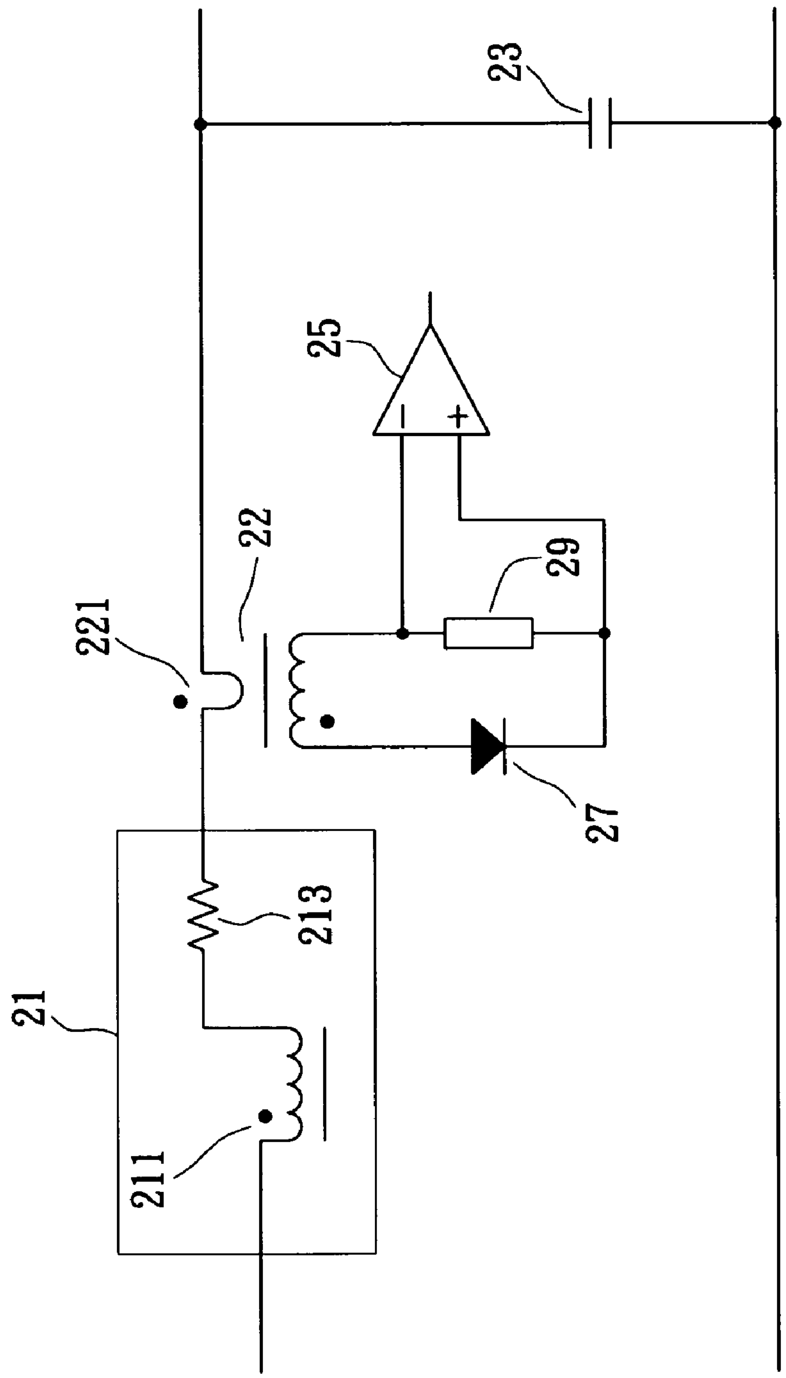
FIG. 2 is a circuit diagram of another current sensing circuit of the prior art.
Figure 3:
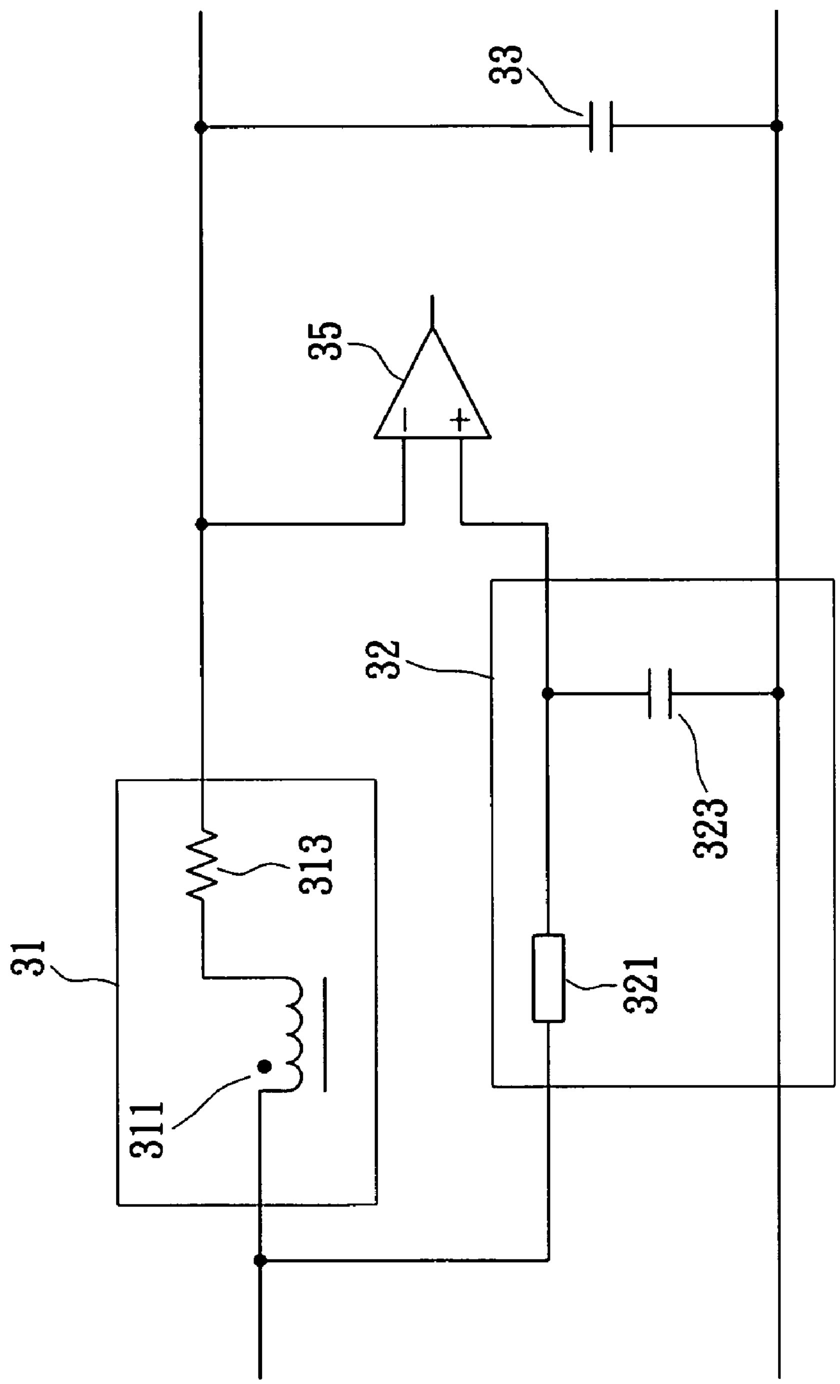
FIG. 3 is a circuit diagram of a further current sensing circuit of the prior art.
Figure 4:
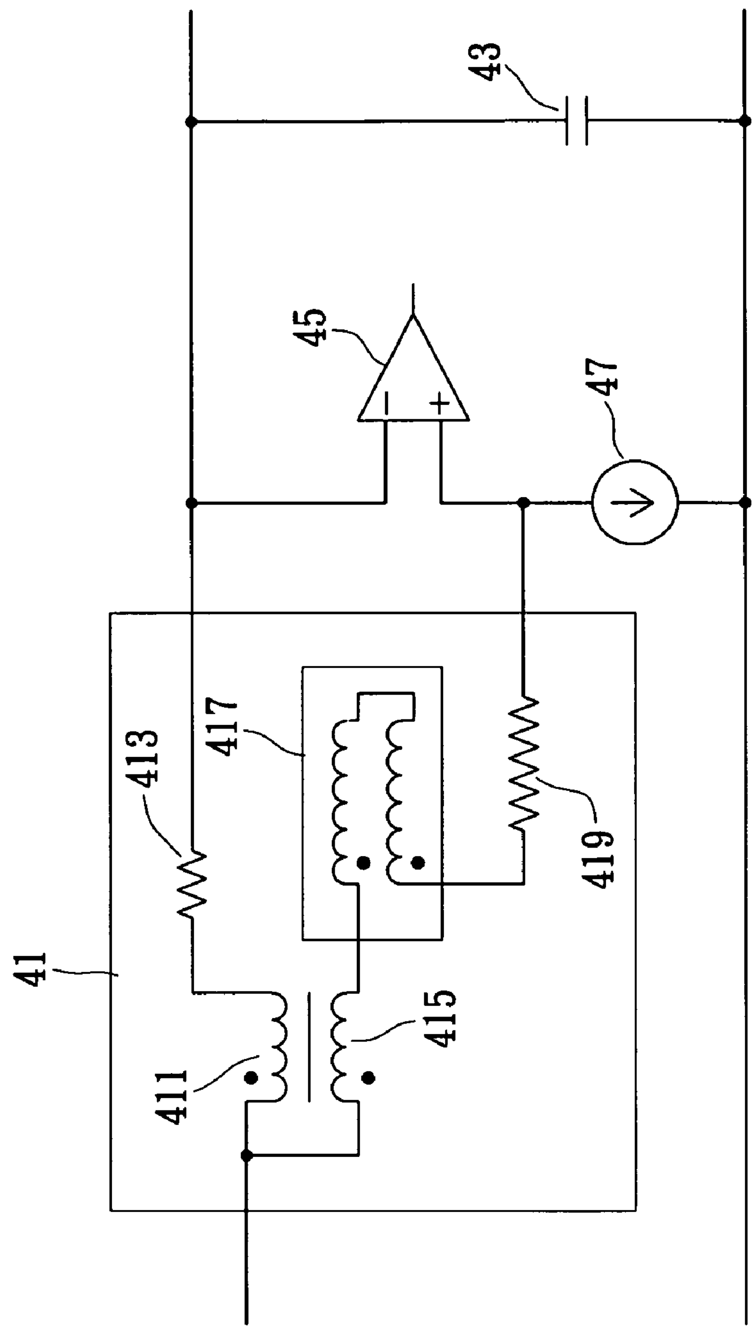
FIG. 4 is a circuit diagram of the current sensing circuit of the first embodiment of the present invention.

Reference is made to FIG. 4, which shows a circuit diagram of the current sensing circuit of the first and preferred embodiment of the present invention. This figure exemplifies the output section of a buck or forward converter. The current sensing circuit 4 includes an inductor 41 and a sensing amplifier 45. The inductor 41 includes a main winding for carrying an inductor current. The main winding is composed of a first inductive portion 411 and a first winding resistance 413. The inductor 41 includes also a detection winding composed of a second winding resistance 419, a second inductive portion 415 which is magnetically coupled with the first inductive portion 411, and a non-inductive portion 417 which is not magnetically coupled with the first inductive portion 411. The non-inductive portion 417 is connected with the second inductive portion 415 in series. The first winding resistance 413 is used as a current sensing resistor. The inductor current is transferred to a capacitor 43. The main winding 411, 413, and the detection winding 415, 417, 419, are connected in series to form a serial circuit. The input of the sensing amplifier 45 is coupled across the serial circuit. The voltage across the whole main winding including the first inductive portion 411 and the first winding resistance 413 is coupled via the detection winding including the second inductive portion 415, the non-inductive portion 417 and the second winding resistance 419 to the sensing amplifier 45 which amplifies the voltage for the use of a control circuit (not shown in the figure). With proper magnetic path and turn-number arrangement, the second inductive portion 415 is made to induce a voltage equal to that of the first inductive portion 411. The voltage across the second inductive portion 415 therefore cancels the ripple voltage across the first inductive portion 411, resulting in no ripple voltage at the input of the sensing amplifier 45. The need of a low-pass filter is eliminated.

Shown also in the invention circuit is a steady reference current 47 drawn through the detection winding. A steady voltage is hence developed across the second winding resistance 419. By properly adjusting the reference current 47, the voltage across the second winding resistance 419 is made to cancel the voltage drop across the first winding resistance 413 for a given inductor current. The sensing amplifier 45 can therefore precisely detect the inductor current at any given level by detecting a total cancellation (zeroing) of its input voltage with a properly adjusted reference current 47.

When both the main winding and detection wind are made of similar material, e.g., copper, and are kept within the same physical package so to subject them to a similar temperature, the thermal variation of their winding resistances (413 and 419) are self-tracking. Their resistance ratio is therefore fixed and the current detection accuracy of the circuit is insensitive to temperature variations.

By using thinner wire or more number of turns in the non-inductive portion 417, the second winding resistance 419 is made much higher than the first winding resistance 413 and the reference current 47 is made much smaller than the inductor current. Power loss due to the reference current is hence reduced. The power loss can further be reduced by returning the reference current to a circuit potentials other than ground level.

Figure 5:
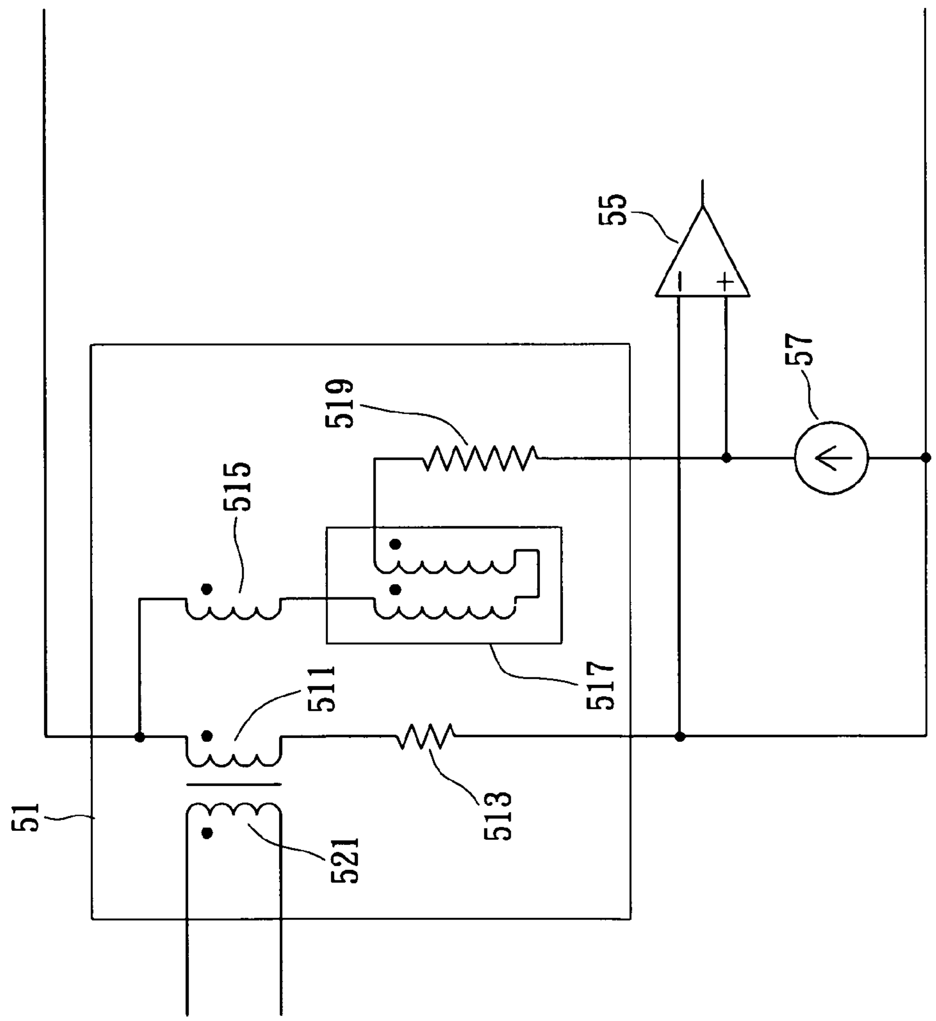
FIG. 5 is a circuit diagram of the current sensing circuit of the second embodiment of the present invention.

Reference is made to FIG. 5, which shows a circuit diagram of the current sensing circuit of the second embodiment of the present invention. This figure exemplifies the output section of a flyback or forward converter. The current sensing circuit 5 includes an inductor 51 and a sensing amplifier 55. The inductor 51 includes a primary winding 521, a secondary winding composed of a first inductive portion 511 and a first winding resistance 513, a detection winding composed of a second winding resistance 519, a second inductive portion 515 which is magnetically coupled with the first inductive portion 511, and a non-inductive portion 517 which is not magnetically coupled with the first inductive portion 511. The non-inductive portion 517 is connected with the second inductive portion 515 in series. The first winding resistance 513 is used as a current sensing resistor. In this embodiment, the primary winding 521 is magnetically coupled with the first inductive portion 511 of the secondary winding. They represent a coupled inductor in a flyback converter circuit or a forward transformer in a forward converter circuit. In either case, an output current flowing through the secondary winding 511, 513, is transferred to the output circuit (not shown in the figure) via rectification and filtering means (not shown in the figure.) The secondary winding 511, 513, and the detection winding 515, 517, 519, are connected in series to form a serial circuit. The input of the sensing amplifier 55 is coupled across the serial circuit. The voltage across the whole secondary winding including the first inductive portion 511 and the first winding resistance 513 is coupled via the detection winding including the second inductive portion 515, the non-inductive portion 517 and the second winding resistance 519 to the sensing amplifier 55 which amplifies the voltage for the use of a control circuit (not shown in the figure). With proper magnetic path and turn-number arrangement, the second inductive portion 515 is made to induce a voltage equal to that of the first inductive portion 511. The voltage across the second inductive portion 515 therefore cancels the AC voltage across the first inductive portion 511, resulting in no AC voltage at the input of the sensing amplifier 55.

Shown also in the invention circuit is a steady reference current 57 fed through the detection winding. A steady voltage is hence developed across the second winding resistance 519. By properly adjusting the reference current 57, the voltage across the second winding resistance 519 is made to cancel the voltage drop across the first winding resistance 513 for a given output current. The sensing amplifier 55 can therefore precisely detect the output current at any given level by detecting a total cancellation (zeroing) of its input voltage with a properly adjusted reference current 57.

When both the secondary winding and the detection winding are made of similar material, e.g., copper, and are kept within the same physical package so to subject them to a similar temperature, the thermal variation of their winding resistances (513 and 519) are self-tracking. Their resistance ratio is therefore fixed and the current detection accuracy of the circuit is insensitive to temperature variations.

By using thinner wire or more number of turns in the non-inductive portion 517, the second winding resistance 519 is made much higher than the first winding resistance 513 and the reference current 57 is made much smaller than the output current. Power loss due to the reference current is therefore reduced.

The description above only illustrates specific embodiments exemplifying the present invention. The present invention should therefore cover various modifications and variations made to the herein-described structure and operations of the present invention, provided they fall within the scope of the present invention as defined in the following appended claims.

What is claimed is:

1. An inductor, comprising:
a primary winding;
a secondary winding for carrying an inductor current and magnetically coupled to the primary winding; and
a detection winding magnetically coupled to the secondary winding;
wherein the secondary winding and the detection winding are connected in series to form a serial circuit with induction voltages of the secondary winding and the detection winding cancelling out each other with respect to the serial circuit.

2. An inductor, comprising:
a primary winding;
a secondary winding for carrying an inductor current and magnetically coupled to the primary winding; and
a detection winding, comprising:
an inductive portion magnetically coupled to the secondary winding; and
a non-inductive portion not magnetically coupled to the secondary winding;
wherein the secondary winding and the detection winding are connected in series to form a serial circuit with induction voltages of the secondary winding and the detection winding cancelling out each other with respect to the serial circuit.

3. A current sensing circuit, comprising:
an inductor having:
a primary winding;
a secondary winding for carrying an inductor current and magnetically coupled to the primary winding; and
a detection winding and magnetically coupled to the secondary winding;
wherein the secondary winding and the detection winding are connected in series to form a serial circuit with induction voltages of the secondary winding and the detection winding cancelling out each other with respect to the serial circuit;
a reference current flowing through the detection winding; and
a voltage sensor measuring a potential difference across ends of the serial circuit.

4. A current sensing circuit, comprising:
an inductor, comprising:
a primary winding;
a secondary winding for carrying an inductor current and magnetically coupled to the primary winding; and
a detection winding, comprising:
an inductive portion magnetically coupled to the secondary winding; and
a non-inductive portion not magnetically coupled to the secondary winding;
wherein the secondary winding and the detection winding are connected in series to form a serial circuit with induction voltages of the secondary winding and the detection winding cancelling out each other with respect to the serial circuit;
a reference current flowing through the detection winding; and
a voltage sensor measuring a potential difference across ends of the serial circuit.

* * * * *